United States Patent [19]

Hess

[11] 4,307,264
[45] Dec. 22, 1981

[54] SYNTHETIC-RESIN HOUSING RESISTANT TO CORROSIVE MEDIA

[76] Inventor: Joachim Hess, Schröplerstrasse 37, 8070 Ingolstadt, Fed. Rep. of Germany

[21] Appl. No.: 86,121

[22] Filed: Oct. 18, 1979

[51] Int. Cl.[3] .............................................. H05K 5/00
[52] U.S. Cl. .................................. 174/52 R; 220/18; 361/364; 361/417
[58] Field of Search ................ 174/50, 52 R, 53, 58, 174/153 G; 361/417, 418, 419, 420, 358, 364–376; 220/18; 200/294, 297

[56] References Cited

U.S. PATENT DOCUMENTS

| | | | |
|---|---|---|---|
| 1,410,035 | 3/1922 | Regan | 361/358 |
| 1,700,669 | 1/1929 | De Ferranti | 361/369 X |
| 3,090,115 | 5/1963 | Carr | 174/153 G X |

FOREIGN PATENT DOCUMENTS 1445888  6/1966  France ............................. 361/364

Primary Examiner—Thomas J. Kozma
Assistant Examiner—D. A. Tone
Attorney, Agent, or Firm—Karl F. Ross

[57] ABSTRACT

A synthetic resin (plastic) housing resistant to corrosive environments and especially adapted to receive electrical or mechanical devices or components, consists of two parts which are joined together with an interposed seal. According to the invention, the two parts have different depths so that each of the parts can be stacked with others of like kind and both of the parts are provided with mounting elements for the selective disposition of the electrical devices or units thereon which transmit force to a support for the housing without stressing the latter.

12 Claims, 8 Drawing Figures

SYNTHETIC-RESIN HOUSING RESISTANT TO CORROSIVE MEDIA

FIELD OF THE INVENTION

My present invention relates to a synthetic resin or plastic housing resistant to corrosive media and, more particularly, to a housing adapted to sealingly receive electrical circuitry, and electrical or mechanical devices or appliances, especially measuring, switching and monitoring devices.

BACKGROUND OF THE INVENTION

In many instances it is necessary to provide housing structures adapted to enclose electrical elements, circuitry, devices, or appliances so as to exclude aggressive substances and media, e.g. corrosive atmospheres, agents and substances which might otherwise interfere with the proper functioning of the electrical device or mechanical appliance.

The housing can be composed of two parts which are fixed together with interposition of a seal and which can be composed of materials inherently resistant to attack by aggressive substances, generally synthetic resins or plastics. The housing members may be provided with engaging or interfitting elements to assist in sealing or joining them together and, for example, one of the two housing portions can be provided with an apron forming a socket in which the rim of the other housing member is received.

Plastic housings of the aforedescribed type have, while providing a sealed chamber, been found to have certain problems. For example, difficulties have been encountered in mounting the electrical devices or units in the housing since the thin-wall structure is frequently overloaded by the weight of the electrical devices and/or the stresses applied by bolts or other fasteners used to secure the devices in place. While an ostensibly simple solution is to increase the wall thickness, this has been found to be uneconomical and to increase the material cost because in some instances the added thicknesses of material is unnecessary. Furthermore, simply increasing the wall thickness results in an increased weight which makes the housing difficult to handle, manipulate and emplace. Another disadvantage of the earlier systems is that they frequently required inordinate amounts of space for transport and storage.

OBJECTS OF THE INVENTION

It is, therefore, the principal object of the present invention to provide an improved two-part housing for the purposes described which is free from the disadvantages enumerated above.

Another object of the present invention is to provide a housing sealing and closure of electrical elements, especially measuring, switching, monitoring and like circuitry, devices and appliances, which can protect them from the environment, is of low weight and low volume, and can be economically fabricated, transported and stored.

Yet another object of the invention is to provide a housing meeting the other objects set forth but which does not have to be overdimensioned with respect to wall thickness to enable the electrical or mechanical devices for which the housing is to be used to be mounted conveniently and with versatility.

SUMMARY OF THE INVENTION

These objects and others which will become apparent hereinafter are attained, in accordance with the present invention, in a synthetic-resin (plastic) housing for electrical components, i.e. measuring, switching, monitoring and other circuit elements, devices or appliances, which comprises two housing portions which have respective mouths turned toward one another and sealingly coupled together along their rims with interposition of a sealing rim, the box-shaped housing parts having different depths and, preferably, being tapered away from their respective mouths so that each type of housing part can be stacked with other housing parts of the same type for transportation and storage.

The walls of each housing part are provided with formations for the selective mounting of components thereon directly or indirectly, e.g. via holders or brackets so that the walls of the housing parts remain essentially load free, i.e. any loading is concentrated upon the supports provided externally of the housing parts. Moreover, these walls, which remain load free, are provided with sealable openings or have the capacity to be provided with sealable openings, e.g. to be traversed by wires or conductors or tubes to be connected to the appliances mounted in the housing.

According to the invention, the mounting means in each housing part are formed along the bottom wall thereof while the lateral walls between the mouth and the respective bottom wall, are free from such mounting means. The mounting means along the bottom wall may be thickened portions, e.g. pedestals, preferably provided at the corners, through which mounting bars forming a rack or frame can be affixed to an external support. Only the lateral walls should be provided with the aforementioned openings to be traversed by the wires, conductors or tubes.

This construction, in which the two housing parts have different depth but similar or identical mounting members and spacing thereof, allows the appliance or device which will be mounted in the housing, to be received in either of the two parts depending upon the size and nature of the device so that, for example, if the device is of relatively small size it can be mounted in the shallow housing part or if larger, in the deeper housing part. Access to the device is thus facilitated.

Because the device is mounted close to the bottom of the respective housing part, it is shielded from the elements when the other housing part is removed.

Furthermore, the mounting of the device along or close to the bottom of one of the housing parts facilitates mounting or adjustment of the device by means of tools introduced through the horizontally open mouth of this housing part which, because of its wide-mouth construction, allows large tools to be used.

Nevertheless the construction of the present invention provides for a space-saving low cost housing whose parts are readily stacked for storage and transportation. Another important advantage is that the mounting elements, e.g. a mounting frame of adjustable bars seated on corner pedestals at the bottom of one of the housing parts, take up the weight without stressing the lateral and bottom walls so that the walls can be relatively thin and even provided with openings which can be plugged if not used, without weakening the structure or providing zones at which breakage may occur.

Each of the housing parts, according to the invention, can have a generally conical configuration, i.e. can taper away from the mouth for ease in stacking. In addition, abutments can be provided especially along the corners, to limit the depth to which each inner stacked part will penetrate into an outer part of the same stack and thereby prevent wedging of the parts together. This facilitates separation or withdrawal of one part from the stack and, in addition, prevents undue strain on the walls of the stacked parts. Especially high stacks can be provided safely in this manner.

It has already been mentioned that the corners are provided with reinforced zones or pedestals unitary with the bottom wall of the structure and injection molded in one piece with the remainder of the housing part, these pedestals being formed with throughgoing openings which can receive blind plugs to seal the passages or bolts or the like forming part of the mounting means. The mounting means may include stress-transmitting bolts designed to transmit stress without applying the stress to the walls of the housing itself. This precludes breakage at the pedestals traversed by the passages. The versatility of the housing is thus high without any danger that the interior will not be sealed by reason of the presence of the mounted elements.

Each of the mounting elements extending through the bottom wall of the housing is preferably formed with a threaded bolt having an externally provided head of polygonal, e.g. hexagonal, configuration which can be lodged in a recess of the housing part formed in the outer surface of the bottom wall and locked internally of the housing by a flat counternut. According to the invention, this bolt can serve as an anchor for elements to be affixed to the bottom wall of the housing along the interior thereof or for affixing external elements, e.g. mounting brackets, to the housing. Consequently, the aforementioned mounting bolt serves as a force-transmitting member while the housing only constitutes a protective enclosure.

The mounting elements can advantageously be formed with internally threaded blind bores opening externally of the housing at one end of the bolt while the internal end is formed with a threaded stud. According to yet another feature of the invention, the mounting means includes rails forming the aforementioned frame and lying at right angles to one another, the rails being of channel shape or C-cross section with the bolts connecting the rails adjustably having a hammer head or T configuration. The channels may be slotted to permit adjustment of one set of rails along the rails at right angles thereto or to permit adjustable mounting of the device upon the rails. The device can also be fastened in place with such screws.

The blind plugs, according to the invention, can also be formed as pressfitted snap-fastened members which can have polygonal flat heads receivable in the recesses mentioned, thereby ensuring a practically hermetic seal excluding the entry of moisture or the like.

According to yet another feature of the invention, the openings in the lateral walls of the housing parts, traversed by wires, tubes or the like, may be grommets which are composed of an elastomeric material, e.g. rubber, and which have an axial cross section with the cross bar of the H being overdimensioned to sealingly fit the opening. This cross bar may be formed with a passage snugly receiving the tube, conductor or wire.

The grommet thus comprises a pair of annular flanges which are interconnected by the cross piece formed with this passage and which overlie the inner and outer surfaces of the lateral wall surrounding the opening. These flanges can be relatively thick and disk-shaped with rounded outer peripheries so as to hug these walls sealingly. A grommet of this configuration permits the member passing therethrough to assume a variety of angles with the wall of the housing without any danger of breaking the seal.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
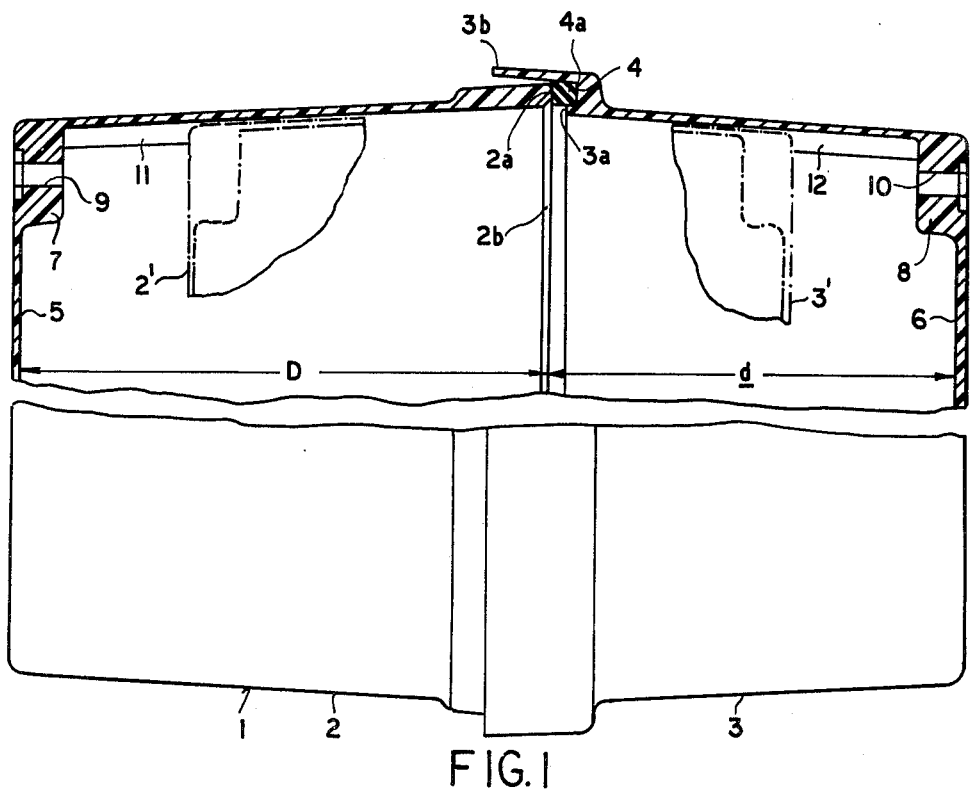
FIG. 1 is a side elevational view of a two-part housing according to the invention with the mounting elements omitted and the upper portion broken away.

As can be seen from FIG. 1, the housing 1 of the present invention comprises two box-shaped housing parts 2, 3 which are held together sealingly with interposition of a seal 4 which is received in an annular recess 4a around the mouth 3a of the housing part 3, the rim of 2a of the mouth 2b of housing part 2 pressing against this seal. The housing part 3 also has an apron 3b which overhangs the mouth of the part 2b of housing part 2 and can be engaged therewith by any conventional holding means known per se, such as screws, hinges, clamps or the like not shown.

The housing parts 2, 3 have different depths, i.e. with the same dimensions and configuration of their bases 5 and 6. The depth d of the housing part 3 is substantially less than the depth D of the housing part 2 so that small electrical devices can be mounted in housing part 3 and larger devices in housing part 2 with equal freedom of access, the other housing part serving as a cover in each case.

Along their bottom walls 5, 6 these two housing parts are provided with reinforced portions or pedestals 7, 8 at the respective corners and, in addition, with triangular-section ribs 11, 12 which rise from these pedestals toward the respective mouths. The ribs 11, 12 form internal abutments for the bottoms for similar housing parts 2', 3' (represented in dot-dash line in FIG. 1) when the housing parts are stacked for transportation and storage.

Each of the pedestals 7, 8 is provided with a throughgoing bore or passage 9, 10 whose role will be described subsequently.

Figure 2:
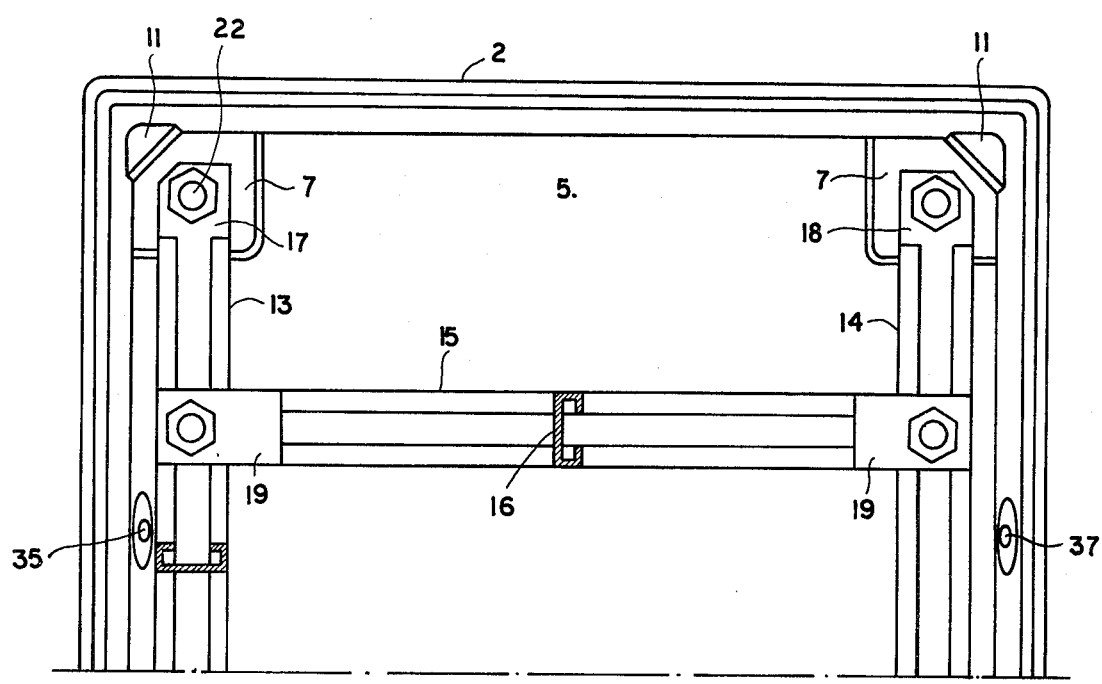
FIG. 2 is an end view through the open mouth of one of the housing parts showing the mounting elements in place.
Figure 3:
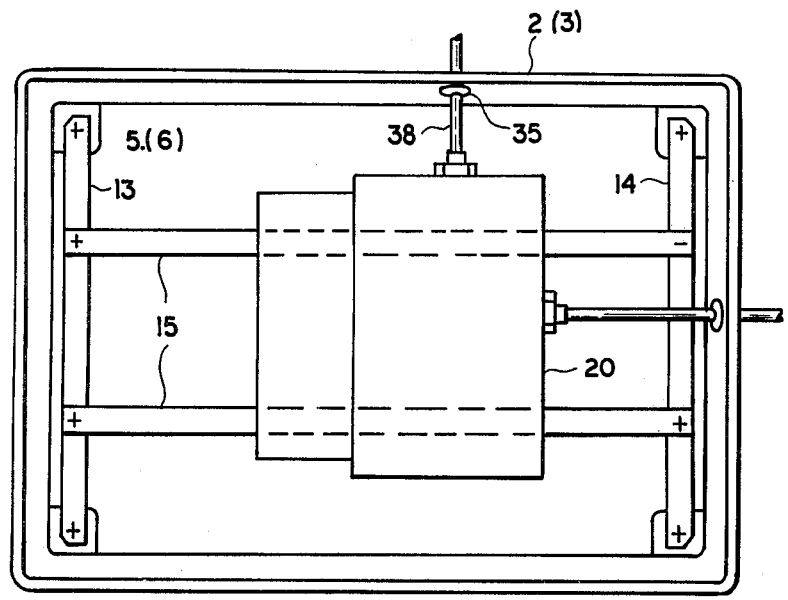
FIG. 3 is a simplified view corresponding to FIG. 2 but illustrating an electrical or mechanical device mounted within the housing part.

As can be seen from FIGS. 2 and 3, four pedestals or reinforced corner portions 7 (or 8) are provided at the corners of each housing part 2 (or 3) and can carry rails 13, 14 of a support frame whose cross bars are shown at 15, the rails and cross bars having a C or channel cross section represented at 16 in FIG. 2.

At their ends, the rails 13–15 are provided with flat steel straps 17, 18, 19 which are anchored to the pedestals or are connected together as illustrated. The frame may be composed of metal, especially iron or steel.

Figure 4:
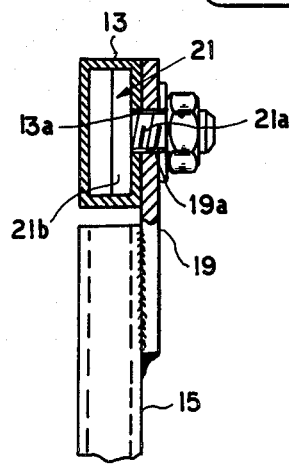
FIG. 4 is a detail view of the connection between two members of the mounting frame.

The frame carries an electrical device 20 as shown in FIG. 3, the connection between the two rails being illustrated in FIG. 4.

The rail 15, for example, has its strap 19 provided with a throughgoing bore 19a through which a shank 21a of a bolt 21 passes. The bolt has a hammer-shaped head 21b received in the channel 13 and passing through the slot 13a thereof. As a result the bolt has a T-shape so that it can be slid anywhere along the slot at which fastening of the rail 15 may be required. Similar bolts can connect the appliance 20 to the rails 15.

Figure 5:
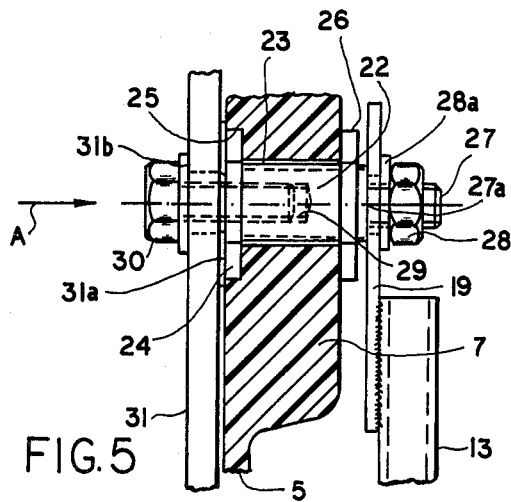
FIG. 5 is a detail view, in cross section, of the connection of this frame through the bottom wall of the housing.
Figure 6:
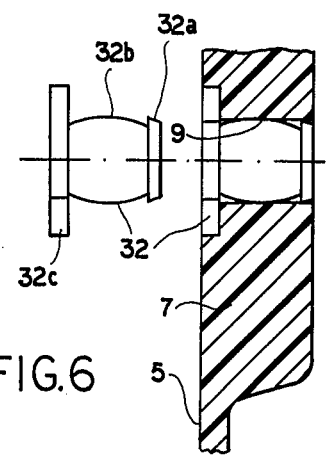
FIG. 6 is a detail view showing the relationship of a sealing plug to this bottom wall of the housing.

The mounting elements 22 for securing the frame at the pedestals 7 are best seen from FIGS. 2 and 5. The mounting elements 22 can comprise externally threaded bolts or members 23 which have, at one end, flat hexagonal heads 24 snugly received in complementarily shaped recesses 25 aligned with the bores 9 of the pedestals. The bolt 23 of each pedestal is inserted in the direction of arrow A (FIG. 5) from the exterior and passes through the bore 9 and is anchored, by a counternut 26 along the inner side of the pedestal 7, the counternut 26 being of flat configuration. Elastomeric sealing washers can surround the bolt 23.

The inner end of the bolt 23 is provided with a threaded stud 27 to which a strap 19 of a rail 13 (or 14) can be anchored by a nut 28 and a lock washer 28a. The strap 19 is thus held against a shoulder 27a between the externally threaded portion of bolt 23 and the stud 27.

At its opposite end, the bolt 23 is provided with an internally threaded blind bore 29 so that a capscrew or threaded bolt 30 can secure a support bar, bracket or rail to the housing, e.g. via a spacer washer 31a and lock washer 31b. Thus effectively the rail 13 and the entire frame structure is supported directly on the bracket 31 which also carries the housing without applying a stress thereto occasioned by the mounting of the device 20 on the frame.

When one of the bores 9 (or 10) is unused, e.g. because the respective housing part serves only as the cover, it is sealed by a blind plug 32 (shaped as the male member of a snap fastener) having a tapered guide flange 32a followed by a barrel-shaped portion 32b and terminating in a hexagonal flange 32c. The barrel-shaped portion 32 and the flange 32a snugly engage the inner surface of the bore while the head 32c is received in the recess 25 previously mentioned. As a result the housing is always fully sealed.

Figures 7, 8:
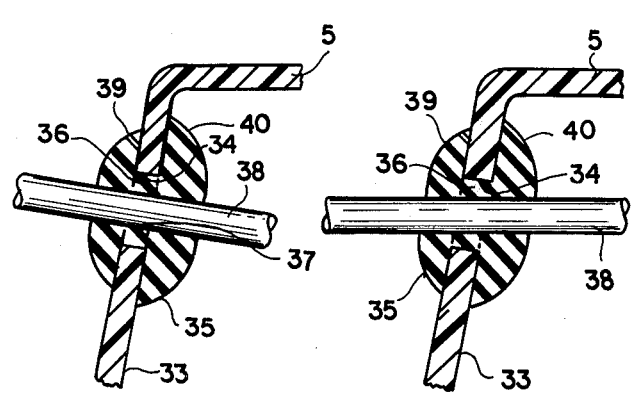
FIG. 7 shows the use of a grommet in an axial cross sectional detail view.
FIG. 8 is a view of the portion of FIG. 7 in a stressed condition.

As can be seen from FIGS. 7 and 8, the lateral walls 33 of the housing parts (reaching from the bottom 5 toward the respective mouth) can be provided with openings 34 in which elastic grommets 35 are inserted. These grommets 35 have, in axial cross section, an H configuration with an overdimensioned central piece 36 provided with a through-going bore 37 sealingly receiving a tube or cable 38. The grommet has a pair of disk-shaped rounded flanges 39, 40 which rest against the outer and inner surface 33 for sealing the housing against the penetration of water, moisture or aggressive gases. While the tube 38 can assume the position shown in FIG. 7 in which it lies at right angles to the wall 33, it can also assume the position shown in FIG. 8 in which the grommet may be stressed without breaking the seal.

I claim:

1. A housing for a device to be sealed from the environment, said housing comprising:
    at least one housing part formed from synthetic resin material and having a mouth formed with a rim, lateral walls extending away from said mouth and a bottom wall remote from said mouth;
    a seal engaging said rim;
    mounting means on said bottom wall for the selective attachment of said device in said housing in said housing part substantially without applying strain to said housing part, said lateral walls being provided with sealable openings affording access to said device; and
    a support adjacent the bottom of said part, said mounting means including mounting elements passing through holes formed in the bottom wall of said part for connecting said support to said device, and including a member traversing each hole and extending entirely therethrough, one end of said member bearing against said support and being anchored thereto by a first bolt, a rail bearing against said member in said housing part and spaced from said bottom wall, said rail being adapted to support said device, whereby said housing part is not stressed by said mounting means.

2. The housing defined in claim 1 wherein two housing parts are provided and open toward one another at respective mouths bearing upon said seal, each of said housing parts being tapered away from the respective mouth toward the respective bottom wall and being formed internally with abutments engageable with other like housing parts upon stacking thereof.

3. The housing defined in claim 1 wherein said bottom wall is formed at corners thereof with respective pedestals traversed by throughgoing bores, said mounting elements traversing at least some of said bores, bores of the housing which are not traversed by said elements being provided with blind plugs sealing the interior of the housing against the exterior thereof.

4. The housing defined in claim 3 wherein said housing part is formed along an external surface of the bottom wall with a polygonal recess registering with the respective bore, each mounting element including a threaded second bolt having a flat head of polygonal configuration received in the respective recess and a threaded stud projecting into the interior of the housing engaged by a nut, said rail being secured to the respective element by the respective nut.

5. The housing defined in claim 4 wherein each of said threaded second bolts is provided with an outwardly open blind threaded bore receiving said first bolt thereby attaching the mounting element to said support.

6. The housing defined in claim 4 wherein said plugs have a snap fastener configuration with a polygonal head adapted to fit into said recess.

7. The housing defined in claim 1 or claim 4 wherein said openings each receive a grommet of elastomeric material having a throughgoing bore and a pair of disk-shaped flanges overlying internal and external surfaces of the respective lateral wall, said flanges being rounded.

8. A housing for a device to be sealed from the environment, said housing comprising:
- two housing parts formed from synthetic resin material and open toward one another, each housing part having a mouth formed with a rim, lateral walls extending away from said mouth and a bottom wall remote from said mouth;
- a seal interposed between said rims;
- mounting means on said bottom walls for the selective attachment of said device in said housing in one of said housing parts substantially without applying strain to said one of said housing parts, said parts having different depths and each being stackable with like housing parts, said lateral walls being provided with sealable openings affording access to said device;
- a support adjacent the bottom of said one of said parts, said mounting means including mounting elements passing through the bottom wall of said one of said parts for connecting said support to said device, said bottom walls being formed at corners thereof with respective pedestals traversed by throughgoing bores, said mounting elements traversing said bores, bores of the housing which are not traversed by said elements being provided with blind plugs sealing the interior of the housing against the exterior thereof, each of said housing parts being formed along an external surface of the respective bottom wall with a polygonal recess registering with the respective bore, each mounting element including a threaded bolt having a flat head of polygonal configuration received in the respective recess and a threaded stud projecting into the interior of the housing engaged by a nut, said mounting means further comprising mounting rails secured to the respective element by the respective nut, said rails forming a frame and including first rails connected to said elements and second rails extending transversely to said first rails and connected thereto, said rails being of channel configuration and receiving T-shaped bolts for attaching said rails together and said device to said rails.

9. The housing defined in claim 8 wherein each of said housing parts is tapered away from the respective mouth toward the respective bottom wall and is formed internally with abutments engageable with other like housing parts upon the stacking thereof.

10. The housing defined in claim 8 wherein each of said bolts is provided with an outwardly open blind threaded bore receiving a screw for attaching the mounting element to said support.

11. The housing defined in claim 8 wherein said plugs have a snap fastener configuration with a polygonal head adapted to fit into said recess.

12. The housing defined in claim 8 wherein said openings each receive a grommet of elastomeric material having a throughgoing bore and a pair of disk-shaped flanges overlying internal and external surfaces of the respective lateral wall, said flanges being rounded.

* * * * *